United States Patent [19]
Kawasaki

[11] Patent Number: 5,115,284
[45] Date of Patent: May 19, 1992

[54] LIGHT-EMITTING DEVICE

[75] Inventor: Hideshi Kawasaki, Atsugi, Japan

[73] Assignee: Canon Kabushiki Kaisha, Tokyo, Japan

[21] Appl. No.: 554,905

[22] Filed: Jul. 20, 1990

[30] Foreign Application Priority Data

Jul. 20, 1989 [JP] Japan .................... 1-186067
Jul. 20, 1989 [JP] Japan .................... 1-186068

[51] Int. Cl.$^5$ ............................ H01L 33/00
[52] U.S. Cl. .................... 357/17; 372/23; 372/45; 372/46; 372/50
[58] Field of Search .......... 372/44, 45, 46, 50, 372/23; 357/17, 16

[56] References Cited

U.S. PATENT DOCUMENTS 4,747,110  5/1988  Takahashi et al. ............ 372/23
4,912,533  3/1990  Takahashi ..................... 357/17

FOREIGN PATENT DOCUMENTS 177617  4/1986  European Pat. Off. .
244081  4/1987  European Pat. Off. .
285358  5/1988  European Pat. Off. .
2592227  6/1987  France .
2203894  10/1988  United Kingdom .

Primary Examiner—James W. Davie
Attorney, Agent, or Firm—Fitzpatrick, Cella, Harper & Scinto

[57] ABSTRACT

A light-emitting device having a first clad layer on a substrate, and a first active layer for light emission by current injection, a second clad layer constituting a first heterogeneous structure with the first active layer and first clad layer, a second active layer for light emission by current injection, a third clad layer constituting a second heterogeneous structure with the second active layer and second clad layer, all formed in concentric manner around the first clad layer, and an electrode for supplying the first and second active layers with electric currents, thereby emitting lights from the first and second active layers by current injection.

34 Claims, 9 Drawing Sheets

LIGHT-EMITTING DEVICE

BACKGROUND OF THE INVENTION

1. Field of the invention

The present invention relates to a light-emitting device such as a semiconductor laser or a light-emitting diode adapted for use in optical communication system, optical integrated circuit, display or the like, and a method for producing said device.

2. Related Background Art

For high-speed transmission of information of a large amount, there is already known wavelength-multiplex optical communication. In such optical communication, the transmission of information is achieved by simultaneously passing, in an optical fiber, plural light beams of mutually different wavelengths, containing mutually independent signals. Also the light source employed in such optical communication is so constructed as to synthesize light beams, emitted from plural separate semiconductor lasers, in an optical synthesizer and to guide thus synthesized light beams into the optical fiber. Such optical synthesizer is described for example by Kojima et al., FPO, Vo.1, 4, No. 7, p. 45 (1979).

However such light source requires very cumbersome assembling and adjustment, as the plural semiconductor lasers and the optical synthesizer have to be aligned respectively with a high precision. For resolving the above-mentioned drawback, there can be conceived monolithic formation of plural light-emitting devices such as semiconductor lasers on a same substrate. The light-emitting devices thus formed facilitate alignment with the optical synthesizer, and enables compactization of the light source.

However such conventional light-emitting device involving plural light-emitting elements is difficult to prepare, and has limit in the extent of integration of devices. Particularly there are various difficulties in obtaining a high-density two-dimensional arrangement of the light-emitting devices.

SUMMARY OF THE INVENTION

In consideration of the foregoing, the object of the present invention is to provide a light-emitting device containing plural light-emitting elements integrated with a high density, and an inexpensive and simple method for producing the same.

The above-mentioned object can be attained, according to the present invention, by a light-emitting device comprising:

a substrate;

a first clad layer formed on a part of said substrate;

a first active layer formed on the outer periphery of said first clad layer on said substrate and adapted to emit light by current injection;

a second clad layer formed on the outer periphery of said first active layer on the substrate, wherein said first active layer and first and second clad layers constitute a first double heterogeneous structure having junctions substantially perpendicular to the surface of the substrate;

a second active layer formed on the outer periphery of said second clad layer on the substrate and adapted to emit light by current injection;

a third clad layer formed on the outer periphery of said second active layer on the substrate, wherein said second active layer and second and third clad layers constitute a second double heterogeneous structure having junctions substantially perpendicular to the surface of the substrate; and electrodes for current supply to said first and second active layer.

Also according to the present invention, there is provided a method for producing the above-mentioned light-emitting device, comprising steps of:

forming, on a part of the surface of a substrate, a nucleation area of a higher nucleation density than in other areas and of a sufficiently small area so as to allow single crystal growth thereon only from a single nucleus;

forming, on said nucleation area, a first clad layer consisting of monocrystalline semiconductor;

forming a first active layer consisting of monocrystalline semiconductor on the outer periphery of said first clad layer on the substrate;

forming a second clad layer consisting of monocrystalline semiconductor on the outer periphery of said first active layer on the substrate, whereby said first active layer and first and second clad layers constitute a first double heterogeneous structure;

forming a second active layer consisting of monocrystalline semiconductor on the outer periphery of said second clad layer on the substrate;

forming a third clad layer on the outer periphery of said second active layer on the substrate, whereby said second active layer and second and third clad layers constitute a second double heterogeneous structure; and forming electrodes for current supply to said first and second active layer.

DESCRIPTION OF THE PREFERRED EMBODIMENTS

Figure 1A:
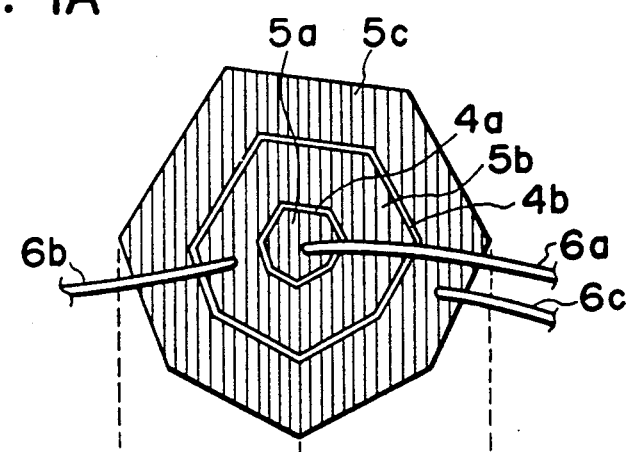
FIGS. 1A and 1B are respectively a schematic plan view and a schematic cross-sectional view of a first embodiment of the light-emitting device of the present invention.
Figure 1B:
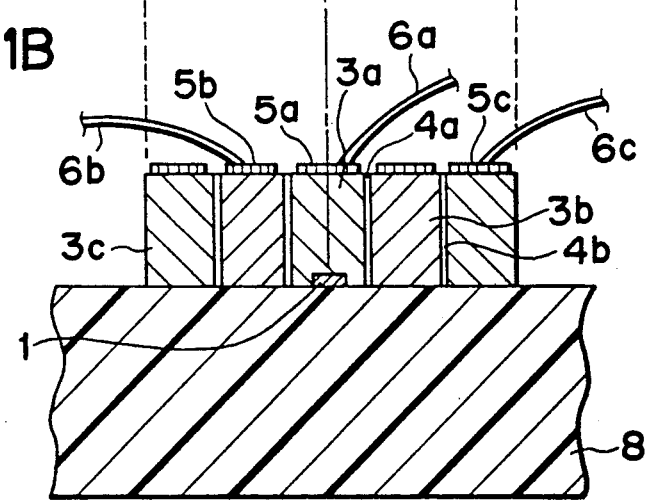
Figure 2A:
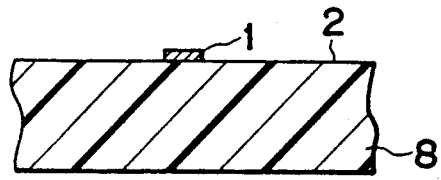
FIGS. 2A, 2B, 2C, 2D and 2E are schematic cross-sectional views showing the process for producing the light-emitting device of the first embodiment.

FIGS. 2A and 1B are respectively a schematic plan view and a schematic cross-sectional view of a first embodiment of the light-emitting device of the present invention.

Referring to FIG. 1B, on a part of an amorphous substrate 8 composed for example of $SiO_2$ or $Al_2O_3$, there is formed a first clad layer 3a consisting of monocrystalline semiconductor. Around said first clad layer 3a, there are concentrically formed, in succession, a first active layer 4a, a second clad layer 3b, a second active layer 4b and a third clad layer 3c. On the first, second and third clad layers 3a, 3b, 3c there are respectively formed electrodes 5a, 5b, 5c, which are connected to an unrepresented external power source respectively through lead wires 6a, 6b, 6c.

The conductive type of said first and third clad layers 3a, 3c is different from that of the second clad layer 3b. Also the semiconductor material constituting the first active layer 4a is different, in combination and/or composition of elements, from that constituting the first and second clad layers 3a, 3b. Consequently these layers constitute a first double heterogeneous structure having junction planes substantially perpendicular to the surface of the substrate. Similarly the second active layer 4b and the second and third clad layers 3b, 3c are composed of mutually different semiconductor materials, and constitute a second double heterogeneous structure having junction planes substantially perpendicular to the surface of the substrate.

In the light-emitting device explained above, when an electric current is injected into the first active layer 4a through the lead wires 6a, 6b and the electrodes 5a, 5b, said active layer 4a emits first light of a certain wavelength above and below perpendicularly to the surface of the substrate. Also an electric current injection through the lead wires 6b, 6c and the electrodes 5b, 5c causes the second active layer 4b to emit second light perpendicularly to the surface of the substrate. Said first and second light emissions can be independently controlled by the adjustment of the injected currents. The first and second lights can be of a same wavelength, or can be of different wavelengths by employing different materials or compositions in the active layers.

As explained in the foregoing, the present invention realizes a compact structure of the light-emitting device emitting plural light beams, as independently controllable light-emitting elements can be positioned very closely. Also as the light-emitting areas in the light-emitting device of the present invention are positioned parallel to the surface of the substrate, there can be obtained a light source providing a larger number of light beams by forming plural devices on a same substrate. It is furthermore possible to form a plurality of the light-emitting devices of the present invention, in a two-dimensional arrangement, on a same substrate.

The device of the present invention can be prepared by a method of growing a single crystal on an amorphous or polycrystalline substrate, utilizing the difference in nucleation density (hereinafter called selective nucleation method). Such selective nucleation method is disclosed for example in the European Laid-Open Patent No. 244,081. Also the European Laid-Open Patent No. 285,358 discloses the technology for producing a light-emitting diode, utilizing said selective nucleation method. In the following there will be explained the method for producing the light-emitting device of the present invention, utilizing the selective nucleation method.

FIGS. 2A to 2E are schematic cross-sectional views showing the method for producing the device of the above-explained first embodiment, wherein said components as those in FIG. 1B are represented by same numbers and will not be explained further.

The surface of the amorphous substrate 8 is a non-nucleation surface with a low nucleation density. At first, on a part of said substrate surface, there is formed, as shown in FIG. 2A, a small deposition film 1 with a nucleation surface having a higher nucleation density than in said non-nucleation surface. The size of said nucleation surface is made sufficiently small so that crystal growth thereon takes place only from a single nucleus.

Figure 2B:
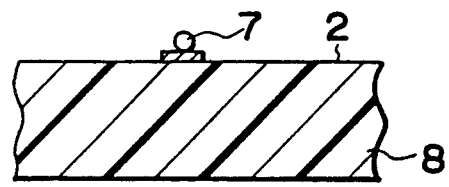

Then, on the substrate 8, there is grown a monocrystalline grain 7 consisting of a III-V semi-conductive compound such as GaAs, AlGaAs, InP, GaInAlAs or GaInP for example by metal organic chemical vapor deposition (MOCVD), liquid phase epitaxy (LPE) or gas source molecular beam epitaxy (gas source MBE). Because of the difference in the nucleation density, said monocrystalline grain 7 grows on the deposition film 1 as shown in FIG. 2B. Because the size of the nucleation surface of the deposition film 1 is very small, the grain 7 grows from a single nucleus and becomes a single crystal.

Subsequently, monocrystalline growths of the first clad layer 3a, first active layer 4a, second clad layer 3b, second active layer 4b and third clad layer 3c are made in succession around the monocrystalline grain 7 explained above. These clad layers and active layers are formed with desired characteristics, for example conductive type, by the adjustments of semiconductor material, composition thereof, and doping impurity therefor.

Figure 2C:
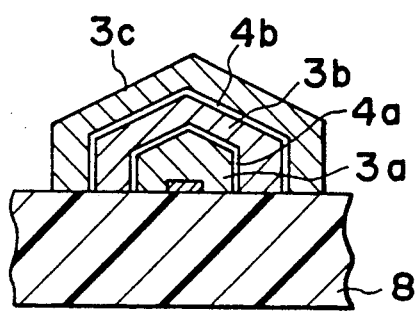
Figure 2D:
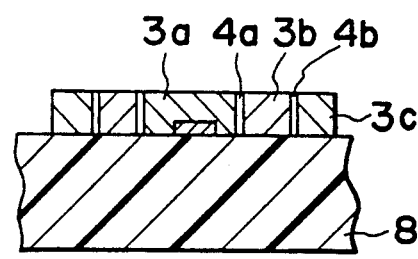

Then, as shown in FIG. 2D, the surface of thus grown semiconductive layers is made planar, parallel to the surface of the substrate, whereby the clad layers and active layers 3a, 4a, 3b, 4b are exposed.

Figure 2E:
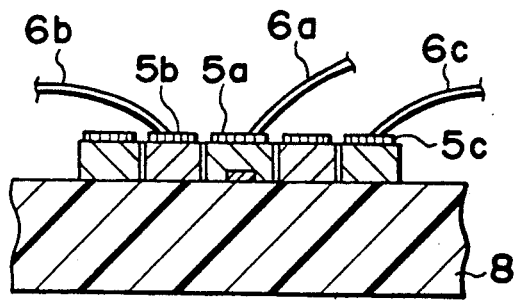

Finally, on the exposed clad layers 3a, 3b, 3c, there are formed electrodes 5a, 5b, 5c as shown in FIG. 2E, and lead wires 6a, 6b, 6c are respectively bonded to said electrodes 5a, 5b, 5c.

The light-emitting device of the first embodiment is thus completed. In the following there will be explained a more specific example.

EXAMPLE 1

The present example, providing a semiconductive laser having two active layers composed of i-GaAs and i-$Ga_{0.9}Al_{0.1}As$, has a structure same as that of the first embodiment and was prepared by a process shown in FIGS. 2A to 2E.

At first $Al_2O_3$ was deposited by evaporation on an amorphous $SiO_2$ substrate 8 and was etched off, leaving a small area (1.2 μm square), whereby a non-nucleation surface ($SiO_2$) 2 and a deposition film 1 constituting the nucleation surface ($Al_2O_3$) were formed as shown in FIG. 2A.

Then a monocrystalline grain 7 consisting of p-$Ga_{0.75}Al_{0.25}As$ was formed as shown in FIG. 2B by MOCVD at a growth temperature 600° C., employing $H_2$ as carrier gas at a rate of 3 l/min., t-butyl arsine (TEAs) at $3 \times 10^{-4}$ mol/min. trimethyl gallium (TMG) at $3 \times 10^{-5}$ mol/min. and trimethyl aluminum (TMA1) at $1 \times 10^{-5}$ mol/min. as source materials, and diethyl zinc (DEZn) as the doping material.

Subsequently there were grown a p-$Ga_{0.75}Al_{0.25}As$ clad layer 3a, an i-GaAs active layer 4a, n-$Ga_{0.25}Al_{0.25}As$ clad layer 3b, an i-$Ga_{0.9}Al_{0.1}As$ active layer 4b and a p-Ga$_{0.75}$Al$_{0.25}$As clad layer 3c as shown in FIG. 2C, by MOCVD at a growth temperature of 600° C. and under a pressure of 100 Torr, employing H$_2$ as carrier gas at a rate of 10 l/min., and suitably switching arsine (AsH$_3$), TMG and TMA1 as source materials and DEZn and silane (SiH$_4$) as the doping material for obtaining a III-V compound semiconductor (V/III=50).

Then the surface of the grown crystal was planarized by reactive ion beam etching (RIBE) as shown in FIG. 2D, thereby exposing the p-Ga$_{0.75}$Al$_{0.25}$As clad layer 3a, n-Ga$_{0.75}$Al$_{0.25}$As clad layer 3b and p-Ga$_{0.75}$Al$_{0.25}$As clad layer 3c. On thus exposed surface there was formed a conductive electrode layer 5 as shown in FIG. 2E, and Au lead wires 6a, 6b, 6c were bonded to the electrodes to complete the semiconductor laser device.

In the above-mentioned semiconductor laser device, the Au lead wire 6b was grounded and the Au lead wire 6a was given a current of 230 mA whereby i-GaAs active layer 4a emitted light of a wavelength $\lambda = 0.9$ $\mu$m. Also when the Au lead wire 6b was grounded and the Au lead wire 6c was given a current of 470 mA, the i-Ga$_{0.9}$Al$_{0.1}$As active layer 4b emitted light of a wavelength of $\lambda = 0.85$ $\mu$m. Said semiconductor laser device had a size of 23×23 $\mu$m, and was easy to prepare.

Figure 3A:
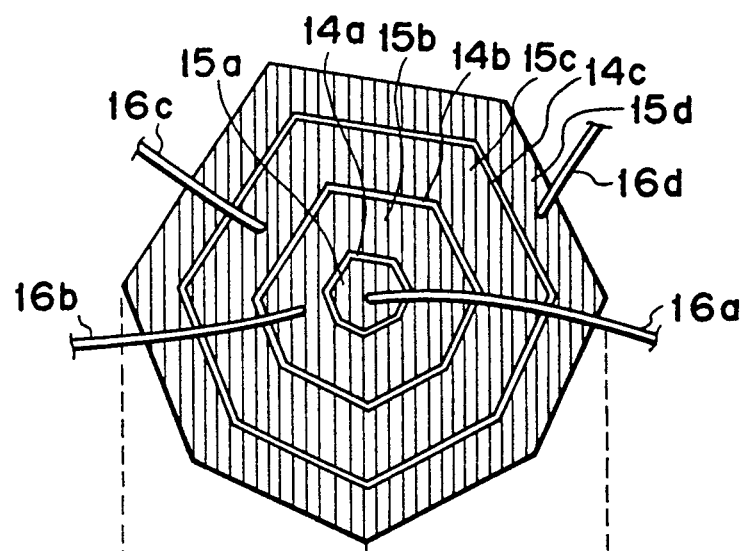
FIGS. 3A and 3B are respectively a schematic plan view and a schematic cross-sectional view of a second embodiment of the light-emitting device of the present invention.
Figure 3B:
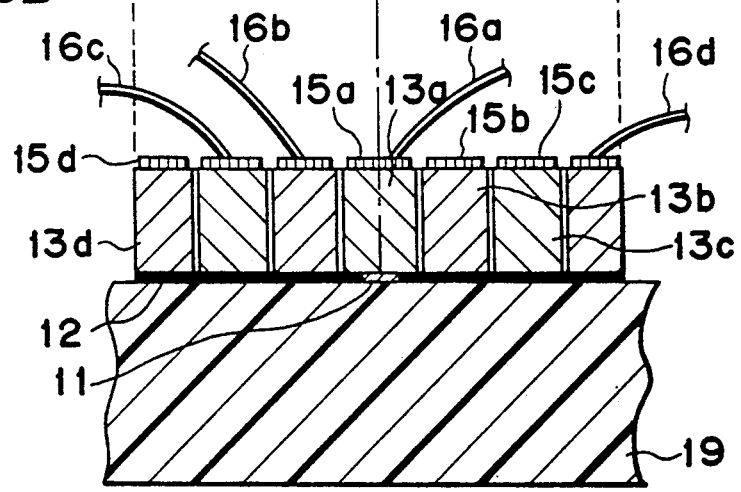

FIGS. 3A and 3B are respectively a schematic plan view and a schematic cross-sectional view of a second embodiment of the light-emitting device of the present invention. Said second embodiment is prepared by the selective nucleation method as in the first embodiment, but is different therefrom in the method of forming the nucleation surface.

Referring to FIG. 3B, on a substrate 19 composed for example of Al$_2$O$_3$, there is formed a layer composed for example of SiO$_2$ and constituting a non-nucleation surface 12. In a part of said layer there is formed a nucleation surface 11 by impurity ion implantation.

On said nucleation surface 11 there is formed a first clad layer 13a consisting of monocrystalline semiconductor. Around said first clad layer 13a, there are formed in succession, in concentric manner, a first active layer 14a, a second clad layer 13b, second active layer 14b, a third clad layer 13c, a third active layer 14c and a fourth clad layer 13d. On said clad layers 13a, 13b, 13c and 13d, there are respectively formed electrodes 15a, 15b, 15c and 15d, which are connected to an unrepresented external power source through lead wires 16a, 16b, 16c and 16d.

The conductive type of said clad layers 13a and 13c is different from that of the clad layers 13b and 13d. The active layer 14a and the clad layers 13a, 13b are composed of semiconductive materials which are mutually different in combination and/or composition of elements, and therefore constitute a first double heterogeneous structure having junction planes substantially perpendicular to the surface of the substrate. Similarly the active layer 14b and the clad layers 13b, 13c constitute a second double heterogeneous structure, and the active layer 14c and the clad layers 13c, 13d constitute a third double heterogeneous structure.

In the light-emitting device explained above, when an electric current is injected into the first active layer 14a, said active layer emits first light above and below perpendicularly to the surface of the substrate. Also current injections into the active layers 14b, 14c cause second and third light emissions perpendicular to the surface of the substrate. Said first to third light emissions can be independently controlled by the adjustment of the injected currents. Said first to third lights can be of a same wavelength, or can be different wavelengths by employing different materials or compositions in said active layers.

FIGS. 4A to 4E are schematic cross-sectional views showing the method for producing the device of the above-explained second embodiment, wherein same components as those in FIG. 3B are represented by same numbers and will not be explained further.

On the surface of the substrate 19, there is formed a non-nucleation surface 12 of a low nucleation density. In a part of said surface 12 there is formed a nucleation surface 11 by implantation of an impurity such as As ions. The size of said nucleation surface is made sufficiently small so that crystal growth thereon takes place only from a single nucleus.

Then, on the substrate 19, there is grown a monocrystalline grain 7 consisting of a III-V compound semiconductor as in the 1st embodiment. Because of the difference in nucleation density, the monocrystalline grain 17 grows on the nucleation surface 11 as shown in FIG. 4B. Because the size of the nucleation surface 11 is very small, the grain 7 grows from a single nucleus and becomes a single crystal.

Figure 4A:
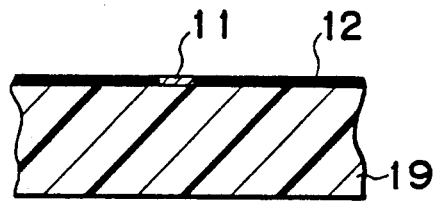
FIGS. 4A, 4B, 4C, 4D and 4E are schematic cross-sectional views showing the process for producing the light-emitting device of the second embodiment.
Figure 4B:
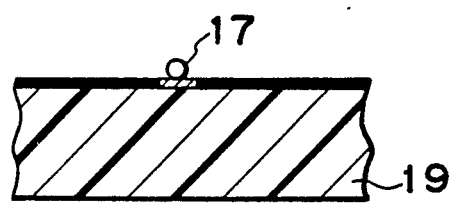
Figure 4C:
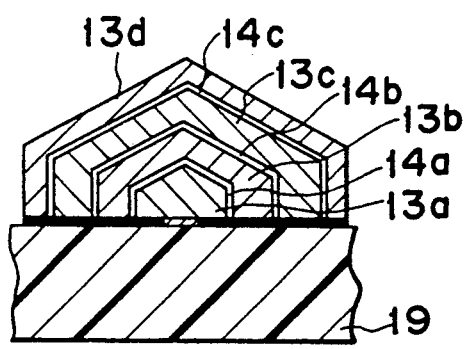

Subsequently, as shown in FIG. 4C, there are conducted monocrystalline growths in succession of the clad layer 13a, active layer 14a, clad layer 13b, active layer 14b, clad layer 13c, active layer 14c and clad layer 13d. These clad layers and active layers are formed with desired characteristics, for example conductive type, by the adjustments of semiconductor material, composition thereof and doping impurity therefor.

Figure 4D:
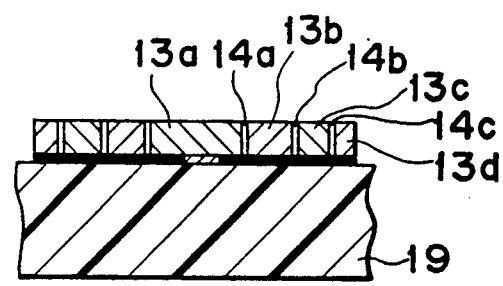

Then, as shown in FIG. 4D, the surface of thus grown semiconductive layers is planarized parallel to the surface of the substrate, whereby the clad layers 13a, 13b, 13c and active layers 14a, 14b, 14c are exposed.

Finally, on the exposed clad layers 13a, 13b, 13c there are respectively formed electrodes 15a, 15b, 15c as shown in FIG. 4C, and lead wires 16a, 16b, 16c are bonded to said electrodes.

The light-emitting device of the second embodiment is thus completed. In the following there will be explained a more specific example.

EXAMPLE 2

The present example, providing a light-emitting diode device having three active layers consisting of i-GaAs, i-Ga$_{0.95}$Al$_{0.05}$As and i-Ga$_{0.9}$Al$_{0.1}$As, has a same structure as that of the second embodiment and was prepared by a process shown in FIGS. 4A to 4E.

At first, as shown in FIG. 4A, SiO$_2$ was deposited by evaporation to form the non-nucleation surface 12 on a ceramic substrate 19. Then As ions were implanted in a small area (size about 1.2 $\mu$m) square to form the nucleation surface 11 of a higher nucleation density.

Then a monocrystalline grain 17 consisting of n-Ga$_{0.8}$Al$_{0.2}$As was formed as shown in FIG. 4B by MOCVD with a growth temperature of 600° C., a III-V compound semiconductor material ratio (V/III)=10 and a pressure of 10 Torr, employing TBAs at $3 \times 10^{-4}$ mol/min., TMG at $4 \times 10^{-5}$ mol/min., and TMA1 at $1 \times 10^{-1}$ mol/min. as source materials and SiH$_4$ as the doping material.

Subsequently there were grown a n-Ga$_{0.8}$Al$_{0.2}$As clad layer 13a, an i-GaAs active layer 14a, a p-Ga$_{0.8}$Al$_{0.2}$As clad layer 13b, an i-Ga$_{0.95}$Al$_{0.05}$As active layer 14b, a n-Ga$_{0.8}$Al$_{0.2}$As clad layer 13c, an i-Ga$_{0.9}$Al$_{0.1}$As active layer 14c, and a p-Ga$_{0.8}$Al$_{0.2}$As clad layer 13d as shown in FIG. 4C, by MOCVD with a growth temperature of 600° C., a V/III ratio of 50 and a pressure of 100 Torr, suitably switching AsH5, TMG and TMA1 as source materials and DEZn and SiH4 as the doping material.

Figure 4E:
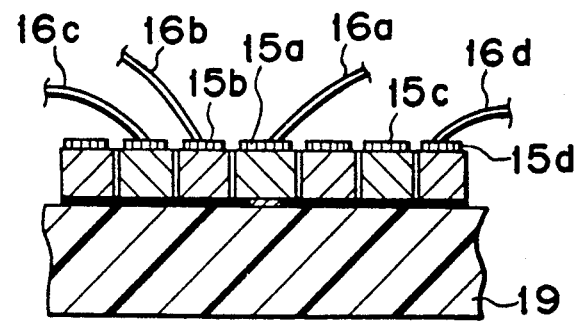

Then the surface of the grown crystals was planarized by RIBE as shown in FIG. 4D, whereby exposed were the n-$Ga_{0.8}Al_{0.2}As$ clad layer 13a, p-$Ga_{0.8}Al_{0.2}As$ clad layer 13b, n-$Ga_{0.8}Al_{0.2}As$ clad layer 13c and $Ga_{0.8}Al_{0.2}As$ clad layer 13d. Then as shown in FIG. 4E, conductive electrode layers 15a–15d were formed, and lead wires 16a–16d were respectively bonded to said electrodes. The light-emitting diode device was thus completed.

In the above-explained LED device, the lead wires 16a, 16b were grounded and the lead wires 16b, 16d were given a current of 100 mA in pulse operation at room temperature, whereby the i-GaAs active layer 14a, i-$Ga_{0.95}Al_{0.05}As$ active layer 14b and i-$Ga_{0.9}Al_{0.1}As$ active layer 14c respectively emitted lights of wavelengths of $\lambda$ - 0.9, 0.87 and 0.85 μm. Said LED device had a size of 44×44 μm and was easy to prepare.

In the following there will be explained an embodiment having high resistance layers or insulating layers for mutually separating plural double heterogeneous structures in the device.

Figure 5A:
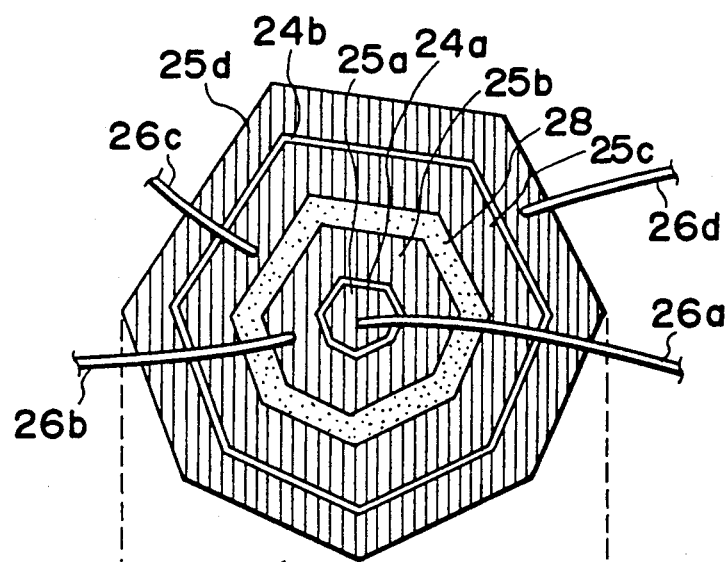
FIGS. 5A and 5B are respectively a schematic plan view and a schematic cross-sectional view of a third embodiment of the light-emitting device of the present invention.
Figure 5B:
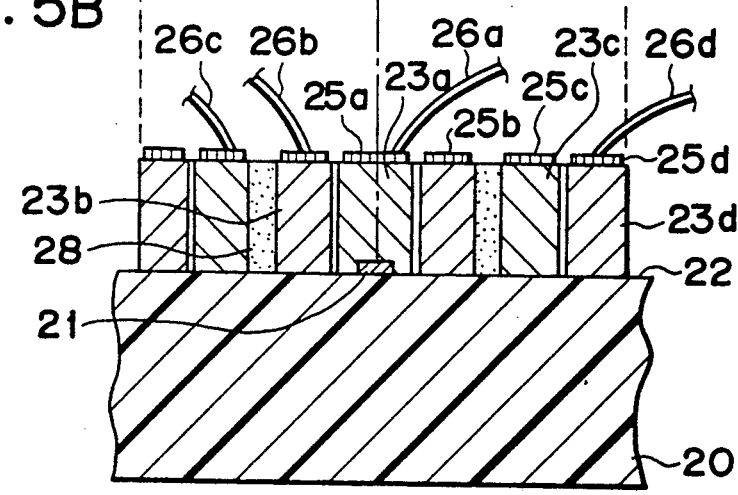

FIGS. 5A and 5B are respectively a schematic plan view and a schematic cross-sectional view of a third embodiment of the light-emitting device of the present invention. The third embodiment is prepared by the selective nucleation method as in the first embodiment.

Referring to FIG. 5B, a substrate 20 consisting of an amorphous material such as $SiO_2$ or $Al_2O_3$ has a non-nucleation surface 22 of a low nucleation density. A nucleation surface 21 is formed by depositing a film on a part of said non-nucleation surface 22.

On said nucleation surface 21, there is formed a first clad layer 23a consisting of monocrystalline semiconductor. Around said first clad layer 23a, there are formed in succession, in concentric manner, a first active layer 24a, a second clad layer 23b, a high resistance layer 28, a third clad layer 23c, a second active layer 24b and a fourth clad layer 25c. On said clad layers 23a, 23b, 23c and 23d, there are respectively formed electrodes 25a, 25b, 25c and 25d, which are connected to an unrepresented external power source through lead wires 26a, 26b, 26c and 26d.

The clad layers 23a and 23b have mutually different conductive types. Also the clad layers 23c and 23d have mutually different conductive types. Furthermore, the active layer 24a and the clad layers 23a, 23b are composed of semiconductor materials which mutually different in combination and/or composition of elements, and constitute, therefore, a first double heterogeneous structure having junction planes substantially perpendicular to the surface of the substrate. Similarly the active layer 24b and the clad layers 23c, 23d constitute a second double heterogeneous structure.

In the above-explained light-emitting device, a current injection into the active layer 24a through the electrodes 25a, 25b causes first light emission from said active layer 24a above and below perpendicularly to the surface of the substrate. Also a current injection into the active layer 24b through the electrodes 25c, 25d causes second light emission perpendicular to the surface of the substrate. Said first and second light emission can be independently controlled by the adjustment of injected currents. Said first and second lights can be of a same wavelength, or of mutually different wavelengths, by employing different materials and/or compositions in said active layers.

In the present embodiment, the high resistance layer 28 electrically separates the clad layers 23b and 23c, thereby preventing eventual current lead between said first and second double heterogeneous structures. This structure provides an advantage of enabling light emission of higher efficiency and lower noises.

FIGS. 6A to 6E are schematic cross-sectional views showing the process for producing the device of the third embodiment, wherein safe components as those in FIG. 5B are represented by same numbers and will not be explained further.

Figure 6A:
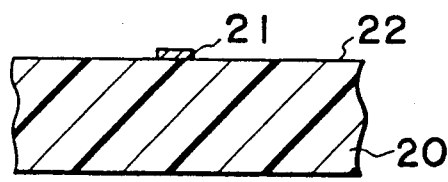
FIGS. 6A, 6B, 6C, 6D and 6E are schematic cross-sectional views showing the process for producing the light-emitting device of the third embodiment.

The surface of a substrate 20 constitutes a non-nucleation surface 22. A nucleation surface 21 is formed by providing a part of said surface 22 with a deposition film as shown in FIG. 6A. The size of said nucleation surface is made sufficiently small so that the crystal growth thereon takes place only from a single nucleus.

Figure 6B:
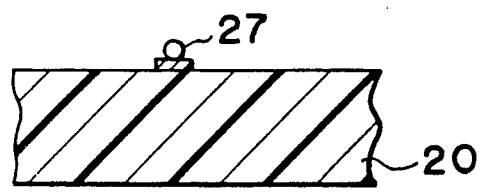

Then, on the substrate 21, there is grown a monocrystalline grain 27 consisting of a III–V compound semiconductor as in the 1st embodiment, for example by MOCVD, LPE or gas source MBE. Said crystal growth is conducted with materials such as trimethyl gallium (TMG), t-butyl arsine (TBAs), As H3 etc. The growth temperature is generally in a range of 500°–800° C., preferably 570°–760° C., most preferably 600°–700° C. Also the pressure at crystal growth is generally in a range of 1–80 Torr, preferably 1–30 Torr, and most preferably 1–10 Torr. Due to the difference in the nucleation density, the monocrystalline grain 27 grows on the nucleation surface 21 as shown in FIG. 6B. Because the size of the nucleation surface 21 is very small, the grain 27 grows from a single nucleus and becomes a single crystal.

Figure 6C:
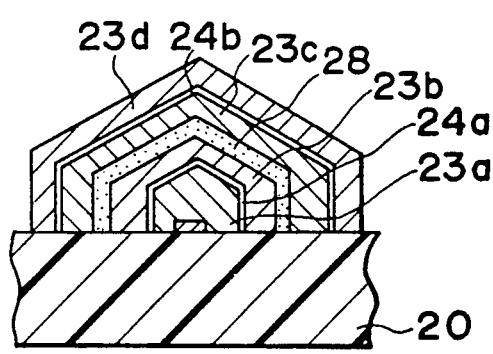

Subsequently there are formed in succession a clad layer 23a, an active layer 24a, a clad layer 23b, a high resistance layer 28, a clad layer 23c, an active layer 24b and a clad layer 23d as shown in FIG. 6C, by changing the pressure generally in a range of 50–760 Torr, preferably 100–760 Torr and most preferably 300–760 Torr, increasing the amount of raw materials and adding an aluminum source such as trimethyl aluminum (TMA1). These clad layers and active layers are formed with desired characteristics, for example conductive type, by the adjustment of the semiconductor materials, composition thereof, and doping material.

Figure 6D:
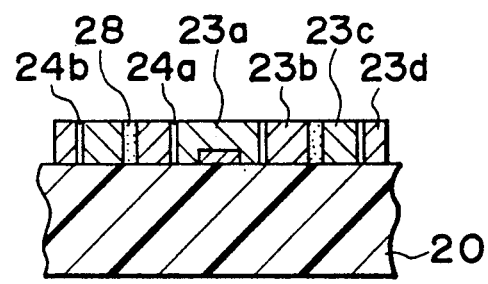

Then, as shown in FIG. 6D, the surface of the grown semiconductor layers is planarized parallel to the surface of the substrate, whereby the clad layers 23a, 23b, 23c, high resistance layer 28 and active layers 24a, 24b are exposed.

Figure 6E:
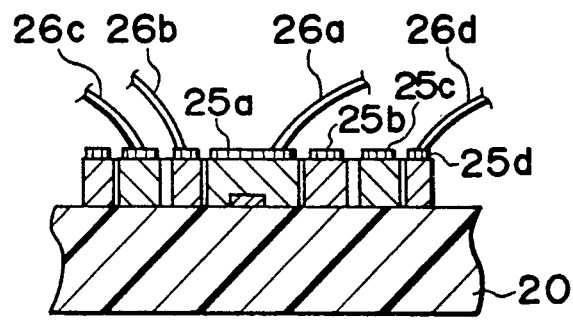

Finally, on the clad layers 23a, 23b, 23c, 23d there are respectively formed electrodes 25a, 25b, 25c, 25d as shown in FIG. 6E, and lead wires 26a, 26b, 26c, 26d are respectively bonded.

The light-emitting device of the 3rd embodiment is prepared in this manner. In the following there will be explained a more specific example.

EXAMPLE 3

The present example, providing a semiconductor laser device having two active layers consisting of i-GaAs and i-$Ga_{0.9}Al_{0.1}As$, has a same structure as in the 3rd embodiment, and was prepared by the process shown in FIGS. 6A to 6E.

At first $Al_2O_3$ was deposited by evaporation on a amorphous $SiO_2$ substrate 20 and was etched off, leaving a small area (1.2 μm square), whereby a non-nucleation surface (SiO$_2$) 22 and a nucleation surface (Al$_2$O$_3$) 21 were formed as shown in FIG. 6A.

Then a monocrystalline grain 27 consisting of p-Ga$_{0.75}$Al$_{0.25}$As was formed as shown in FIG. 6B by MOCVD at a growth temperature of 600° C., employing H$_2$ as carrier gas at a rate of 3 l/min., t-butyl arsine (TEAs) at $3 \times 10^{-4}$ mol/min, trimethyl gallium (TMG) at $3 \times 10^{-5}$ mol/min. and trimethyl aluminum (TMA1) at $1 \times 10^{-5}$ mol/min. as source materials, and diethyl zinc (DEZn) as the doping material.

Subsequently there were grown a p-Ga$_{0.75}$Al$_{0.25}$As clad layer 23a, an i-GaAs active layer 24a, a n-Ga$_{0.75}$Al$_{0.25}$As clad layer 23b, an i-Ga$_{0.7}$Al$_{0.3}$As high resistance layer 28, a n-Ga$_{0.75}$Al$_{0.25}$As clad layer 23c, an i-Ga$_{0.9}$Al$_{0.1}$As active layer 24b and a p-Ga$_{0.75}$Al$_{0.25}$As clad layer 23d as shown in FIG. 6C, by MOCVD at a growth temperature of 600° C., under a pressure of 100 Torr and with III–V compound semiconductor materials (V/III = 50), and with suitable switching of arsine (AsH$_3$), TMG and TMA1 as source materials and DEZn and silane (SiH$_4$) as doping materials.

Then the surface of the grown crystal was planarized by RIBE as shown in FIG. 6E to expose the clad layers 23a–23c. As shown in FIG. 6E, on thus exposed surfaces, there were formed conductive electrode layers 25a–25d, and Au lead wires 26a–26d were respectively bonded thereto.

In the above-explained semiconductor laser device, in a pulsed operation at room temperature, the i-GaAs active layer 24a shown a threshold current of 200 mA, while the i-Ga$_{0.9}$Al$_{0.1}$As active layer 24b showed a threshold current of 410 mA.

Figure 7A:
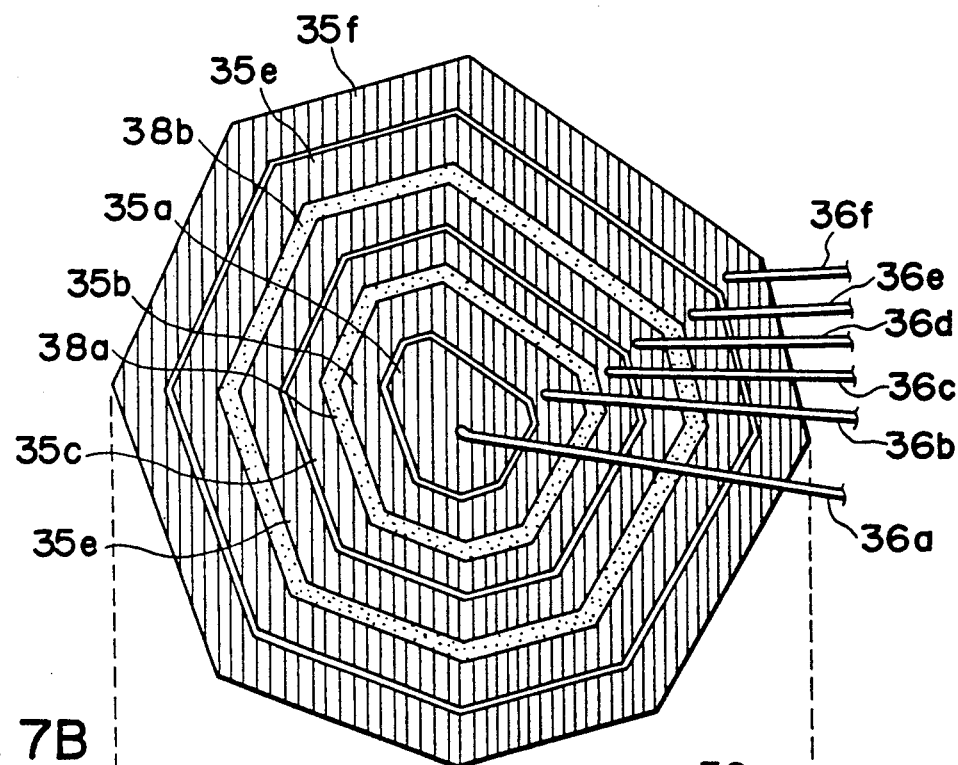
FIGS. 7A and 7B are respectively a schematic plan view and a schematic cross-sectional view of a fourth embodiment of the light-emitting device of the present invention.
Figure 7B:
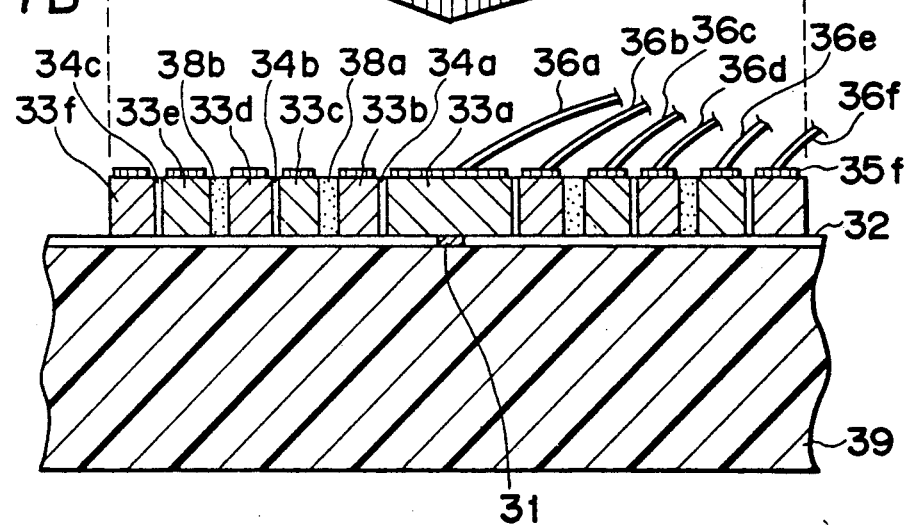

FIGS. 7A and 7B are respectively a schematic plan view and a schematic cross-sectional view of a fourth embodiment of the light-emitting device of the present invention. Said fourth embodiment is prepared by the selective nucleation method as in the third embodiment, but is different therefrom in the method of forming the nucleation surface.

Referring to FIG. 7B, on a substrate 39 composed for example of Al$_2$O$_3$, there is formed a layer composed for example of SiO$_2$ and constituting a non-nucleation surface 32. In a part of said layer there is formed a nucleation surface 31 by impurity ion implantation.

On said nucleation surface 31 there is formed a first clad layer 33a consisting of monocrystalline semiconductor. Around said first clad layer 33a, there are formed in succession, in concentric manner, a first active layer 34a, a second clad layer 33b, a first high resistance layer 38a, a third clad layer 33c, a second active layer 34b, a fourth clad layer 33d, a second high resistance layer 38b, a fifth clad layer 33e, a third active layer 34c and a sixth clad layer 33f. On said clad layers 33a, 33b, 33c, 33d, 33e and 33f, there are respectively formed electrodes 35a, 35b, 35c, 35d, 35e and 35f, which are connected to an unrepresented external power source through lead wires 36a, 36b, 36c, 36d, 36e and 36f.

Said clad layer pair 33a and 33b; 33c and 33d; or 33e and 33f, have mutually different conductive types. Also the active layer 34a and the clad layers 33a, 33b are composed of semiconductive materials which are mutually different in combination and/or composition of elements, and therefore constitute a first double heterogeneous structure having junction planes substantially perpendicular to the surface of the substrate. Similarly the active layer 34b and the clad layers 33c, 33d constitute a second double heterogeneous structure, and the active layer 34c and the clad layers 33e, 33f, constitute a third double heterogeneous structure.

In the above-explained light-emitting device, a current injection into the active layer 34a induces first light emission above and below perpendicular to the surface of the substrate. Also current injections to the active layers 34b, 34c induce second and third light emissions perpendicular to the surface of the substrate. These first to third light emissions can be independently controlled by the adjustment of the injected currents. Said first to third lights can be of a same wavelength, or can be of mutually different wavelengths by employing different materials or compositions in said active layers.

In the present embodiment, the high resistance layer 38a electrically separates the clad layers 33b and 33c, while the high resistance layer 38b electrically separates the clad layers 33d and 33e. Thus, these high resistance layers prevent mutual current leakage among the 1st to 3rd double heterogeneous structures. The structure of the present embodiment provides an advantage of light emission of higher efficiency and lower noises.

FIGS. 8A to 8E are schematic cross-sectional views showing the process for producing the device of the 4th embodiment, wherein same components as those in FIG. 7B are represented by same numbers and will not be explained further.

The surface of a substrate 39 constitutes a non-nucleation surface 32. On a part of said surface 32, there is formed a nucleation surface 31 by impurity ion implantation. The size of said nucleation surface is made sufficiently small so that the crystal growth thereon takes place only from a single nucleus.

Then, on the substrate 39, there is grown a monocrystalline grain 37 consisting of a III–V compound semiconductor as in the 3rd embodiment, for example by MOCVD, LPE or gas source MBE. Said crystal growth is conducted with same materials, growth temperature and pressure in the film forming apparatus as those in the 3rd embodiment. Because of the difference in nucleation density, the monocrystalline grain 37 grows on the nucleation surface 31 as shown in FIG. 8B. Because the size of the nucleation surface 31 is very small, the grain 37 grows from a single nucleus and becomes a single crystal.

Figure 8A:
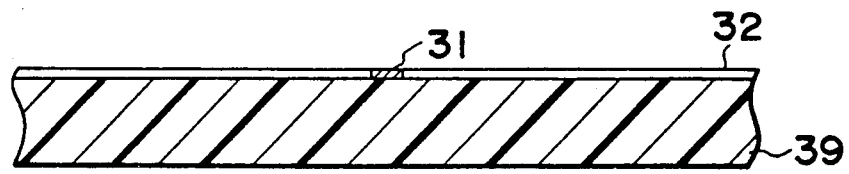
FIGS. 8A, 8B, 8C, 8D and 8E are schematic cross-sectional views showing the process for producing the light-emitting device of the fourth embodiment.
Figure 8B:
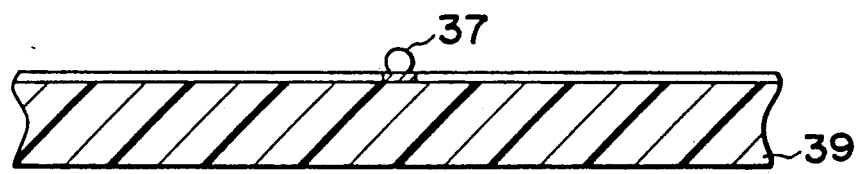
Figure 8C:
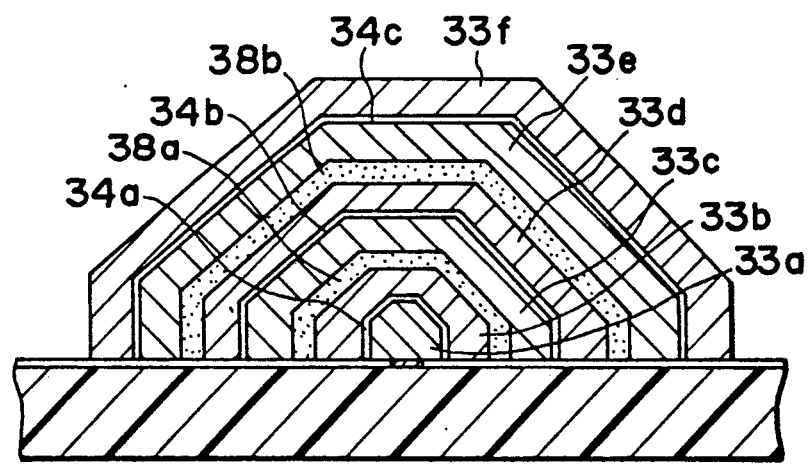

Subsequently there are formed in succession a clad layer 33a, an active layer 34a, a clad layer 33b, a high resistance layer 38a, a clad layer 33c, an active layer 34b, a clad layer 33d, a high resistance layer 38b, a clad layer 33e, an active layer 34c and a clad layer 33f, as shown in FIG. 8C by changing the pressure as in the 3rd embodiment, increasing the amount of supplied raw materials and adding aluminum-containing material thereto. These clad layers and active layers are formed with desired characteristics, for example conductive type, by the adjustment of the semiconductor materials, composition thereof, and doping material.

Figure 8D:
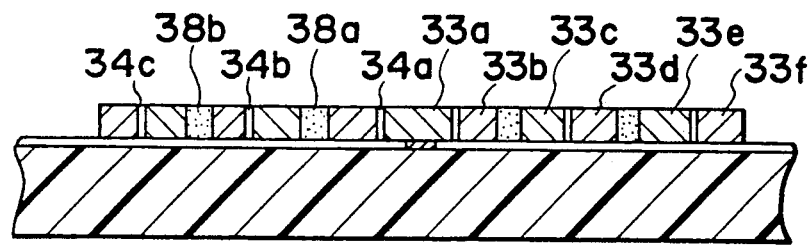

Then, as shown in FIG. 8D, the surface of the grown semiconductor layers is planarized parallel to the surface of the substrate, whereby the clad layers 33a, 33b, 33c, 33d, 33e are exposed.

Figure 8E:
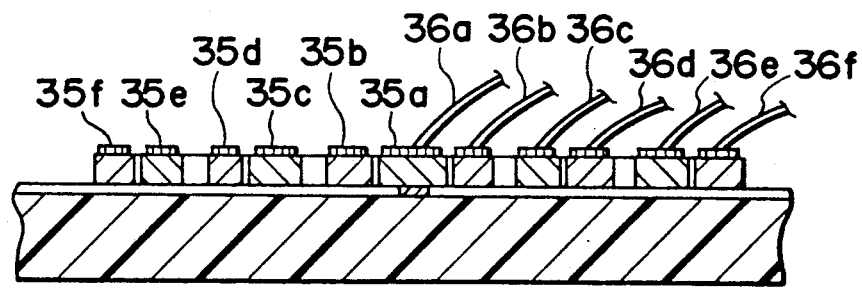

Finally, on the clad layers 33a–33f, there are respectively formed electrodes 35a–35f as shown in FIG. 8E, and lead wires 36a–36g are respectively bonded.

The light-emitting device of the 4th embodiment is prepared in this manner. In the following there will be explained a more specific example.

EXAMPLE 4

The present example, providing a light-emitting diode device having three active layers respectively of i-GaAs, i-Ga$_{0.95}$Al$_{0.05}$As and i-Ga$_{0.9}$Al$_{0.1}$As, has a same structure as in the 4th embodiment and was prepared by the process shown in FIGS. 8A-8E.

At first, as shown in FIG. 8A, SiO$_2$ was deposited by evaporation to form the non-nucleation surface 32 on a ceramic substrate 39. Then As ions were implanted in a small area (size about 1.2 μm square) to form the nucleation surface 31 of a higher nucleation density.

Then a monocrystalline grain 37 consisting of n-Ga$_{0.8}$Al$_{0.2}$As was formed as-shown in FIG. 8B by MOCVD with a growth temperature of 600° C., a III-V compound semiconductor material ratio (V/III)=10 and a pressure of 10 Torr, employing TBAs, TMG and TMA1 as the source materials and SiH$_4$ as the doping material.

Subsequently there were grown in succession a n-Ga$_{0.8}$Al$_{0.2}$As clad layer 33a, an i-GaAs active layer 34a, a p-Ga$_{0.8}$Al$_{0.2}$As clad layer 33b, an i-Ga$_{0.7}$Al$_{0.3}$As high resistance layer 38a, a p-Ga$_{0.8}$Al$_{0.2}$As clad layer 38c, an i-Ga$_{0.95}$Al$_{0.05}$As active layer 34b, a n-Ga$_{0.8}$Al$_{0.2}$As clad layer 33d, an i-Ga$_{0.7}$Al$_{0.3}$As clad layer 33d, an i-Ga$_{0.7}$Al$_{0.3}$As high resistance layer 38b, a p-Ga$_{0.8}$Al$_{0.2}$As clad layer 33e, an i-Ga$_{0.9}$Al$_{0.1}$As active layer 34c and a n-Ga$_{0.8}$Al$_{0.2}$As clad layer 33f, as shown in FIG. 8C, by MOCVD with a growth temperature of 600° C., a V/III ratio of 50 and a pressure of 100 Torr, suitably switching AsH$_3$, TMG and TMA1 as the source materials and DEZn and SiH$_4$ as the doping material.

Then the surface was planarized by RIBE as shown in FIG. 8D, whereby the clad layers 33a-33e were exposed.

Finally conductive electrode layers 35a-35f were formed as shown in FIG. 8E, and lead wires 36a-36f were respectively bonded.

In the light-emitting device explained above, when the lead wire on the n-Ga$_{0.8}$Al$_{0.2}$As layer 38d was grounded and a current of 100 mA was injected into the i-Ga$_{0.95}$Al$_{0.05}$As active layer 34b in a pulsed operation at room temperature, the output of said active layer showed an intensity ratio of −20 dB to the optical output of other active layer.

In addition to the foregoing embodiments, the present invention is applicable to various purposes. For example, the high resistance layers in the 3rd and 4th embodiments may be replaced by insulating layers. Also the light-emitting device of the present invention is usable not only to the light source of the aforementioned optical communication system but also to other various applications. For example a color display without color filters can be obtained by arranging the light-emitting devices of the present invention, having three active layers respectively emitting red, blue and green lights, two-dimensionally on a same substrate.

The present invention includes all such variations within the scope and spirit of the appended claims.

What is claimed is:

1. A light-emitting device comprising:
    a substrate;
    a first clad layer of a predetermined extent formed on a part of said substrate;
    a first active layer formed on the outer periphery of said first clad layer on the substrate and adapted to emit light by current injection;
    a second clad layer formed on the outer periphery of said first active layer on the substrate, wherein said first active layer and said first and second clad layers constitute a first double heterogeneous structure having junction-planes substantially perpendicular to the surface of the substrate;
    a second active layer formed on the outer periphery of said second clad layer on the substrate and adapted to emit light by current injection;
    a third clad layer formed on the outer periphery of said second active layer on the substrate, wherein said second active layer and said second and third clad layers constitute a second double heterogeneous structure having junction planes substantially perpendicular to the surface of the substrate; and
    electrodes for supplying said first and second active layers with electric currents.

2. A light-emitting device according to claim 1, wherein said first and second active layers emit lights of mutually different wavelengths.

3. A light-emitting device according to claim 1, wherein said first and third clad layers have either of p and n conductive types, and said second clad layer has the other conductive type.

4. A light-emitting device according to claim 3, wherein said active layers are composed of non-doped semiconductors.

5. A light-emitting device according to claim 1, wherein said active layers and clad layers are composed of compound semiconductors of groups III-V of the periodic table.

6. A light-emitting device according to claim 5, wherein said active layer and clad layers are composed of GaAs or GaAlAs.

7. A light emitting device comprising:
    a substrate having a crystal forming surface consisting of a non-nucleation surface of a low nucleation density and a nucleation surface having a higher nucleation density than in said non-nucleation surface, positioned adjacent to said non-nucleation surface and having such sufficiently small size that the crystal growth thereon takes place only from a single nucleus;
    a first clad layer consisting of monocrystalline semiconductor and formed on a small area on said substrate including the nucleation surface;
    a first active layer consisting of monocrystalline semiconductor, formed on the outer periphery of said first clad layer on said substrate and adapted to emit light by current injection;
    a second clad layer consisting of monocrystalline semiconductor and formed on the outer periphery of said first active layer, wherein said first active layer and said first and second clad layers constitute a first double heterogeneous structure having junction planes substantially perpendicular to said surface of the substrate;
    a second active layer consisting of monocrystalline semiconductor, formed on the outer periphery of said second clad layer on said substrate and adapted to emit light by current injection
    a third clad layer consisting of monocrystalline semiconductor and formed on the outer periphery of said second active layer on said substrate, wherein said second active layer and said second and third clad layers constitute a second double heterogeneous structure having junction planes substantially perpendicular to said surface of said substrate; and electrodes for providing said first and active layers with electric currents.

8. A light-emitting device according to claim 7, wherein said substrate is composed of a member of a low nucleation density and a film composed of a material of a higher nucleation density than in said member and formed in a part of the surface of said member.

9. A light-emitting device according to claim 8, wherein said substrate is composed of a plate member consisting of $SiO_2$ and a small film consisting of $Al_2O_3$ formed on the surface of said plate member.

10. A light-emitting device according to claim 7, wherein said substrate is composed of a member of a low nucleation density and a nucleation surface formed in a part of the surface of said member by implantation of impurity ions.

11. A light-emitting device according to claim 10, wherein said substrate is composed of a ceramic plate member, an $SiO_2$ film formed thereon, and As ions implanted in a small area on the surface of said film.

12. A light-emitting device according to claim 7, wherein said first and second active layers emit lights of mutually different wavelengths.

13. A light-emitting device according to claim 7, wherein said first and third clad layers have either of p and n conductive types, and said second clad layer has the other conductive type.

14. A light-emitting device according to claim 13, wherein said active layers are composed of non-doped semiconductors.

15. A light-emitting device according to claim 7, wherein said active layers and clad layers are composed of compound semiconductors of groups III-V of the periodic table.

16. A light-emitting device according to claim 15, wherein said active layers and clad layers are composed of GaAs or GaAlAs.

17. A light-emitting device comprising:
a substrate;
a first clad layer formed on a part of said substrate;
a first active layer formed on the outer periphery of said first clad layer on the substrate and adapted to emit light by current injection;
a second clad layer formed on the outer periphery of said first active layer on the substrate, wherein said first active layer and said first and second clad layers constitute a first double heterogeneous structure having junction planes substantially perpendicular to the surface of the substrate;
an insulating or high resistance layer formed on the outer periphery of said second clad layer on the substrate;
a third clad layer formed on the outer periphery of said insulating or high resistance layer on the substrate;
a second active layer formed on the outer periphery of said third clad layer on the substrate and adapted to emit light by current injection;
a fourth clad layer formed on the outer periphery of said second active layer on the substrate, wherein said second active layer and said third and fourth clad layers constitute a second double heterogeneous structure having junction planes substantially perpendicular to the surface of the substrate; and electrodes for supplying said first and second active layers with electric currents.

18. A light-emitting device according to claim 17, wherein said first and second active layers emit lights of mutually different wavelengths.

19. A light-emitting device according to claim 17, wherein said first clad layer has one of p and n conductive types while said second clad layer has the other conductive type, and said third clad layer has one of p and n conductive types while said fourth clad layer has the other conductive type.

20. A light-emitting device according to claim 18, wherein said active layers are composed of non-doped semiconductors.

21. A light-emitting device according to claim 17, wherein said active layers and clad layers are composed of compound semiconductors of groups III-V of the periodic table.

22. A light-emitting device according to claim 21, wherein said active layers and clad layers are composed of a GaAs or GaAlAs.

23. A light-emitting device according to claim 22, wherein said insulating or high resistance layer is composed of non-doped GaAlAs.

24. A light emitting device comprising:
a substrate having a crystal forming surface consisting of a non-nucleation surface of a low nucleation density and a nucleation surface having a higher nucleation density than in said non-nucleation surface, positioned adjacent to said non-nucleation surface and having such sufficiently small size that the crystal growth thereon takes place only from a single nucleus;
a first clad layer consisting of monocrystalline semiconductor and formed on a small area on said substrate including the nucleation surface;
a first active layer consisting of monocrystalline semiconductor, formed on the outer periphery of said first clad layer on said substrate and adapted to emit light by current injection;
a second clad layer consisting of monocrystalline semiconductor and formed on the outer periphery of said first active layer, wherein said first active layer and said first and second clad layers constitute a first double heterogeneous structure having junction planes substantially perpendicular to the surface of said substrate;
an insulating or high resistance layer formed on the outer periphery of said second clad layer on said substrate;
a third clad layer consisting of monocrystalline semiconductor and formed on the outer periphery of said insulating or high resistance layer on said substrate;
a second active layer consisting of monocrystalline semiconductor, formed on the outer periphery of said third clad layer on said substrate, and adapted to emit light by current injection;
a fourth clad layer consisting of monocrystalline semiconductor and formed on the outer periphery of said second active layer on said substrate, wherein said second active layer and said third and fourth clad layers constitute a second double heterogeneous structure having junction planes substantially perpendicular to said surface of said substrate; and
electrodes for supplying said first and second active layers with electric currents.

25. A light-emitting device according to claim 24, wherein said substrate is composed of a member of a low nucleation density and a film composed of a material of a higher nucleation density than in said member and formed in a part of the surface of said member.

26. A light-emitting device according to claim 25, wherein said substrate is composed of a plate member consisting of $SiO_2$ and a small film consisting of $Al_2O_3$ formed on the surface of said plate member.

27. A light-emitting device according to claim 24, wherein said substrate is composed of a member of a low nucleation density and a nucleation surface formed in a part of the surface of said member by implantation of impurity ions.

28. A light-emitting device according to claim 27, wherein said substrate is composed of a ceramic plate member, an $SiO_2$ film formed thereon, and As ions implanted in a small area on the surface of said film.

29. A light-emitting device according to claim 24, wherein said first and second active layers emit lights of mutually different wavelengths.

30. A light-emitting device according to claim 24, wherein said first clad layer has one of p and n conductive types while said second clad layer has the other conductive type, and said third clad layer has one of p and n conductive types while said fourth clad layer has the other conductive type.

31. A light-emitting device according to claim 30, wherein said active layers are composed of non-doped semiconductors.

32. A light-emitting device according to claim 24, wherein said active layers and clad layers are composed of compound semiconductors of groups III–V of the periodic table.

33. A light-emitting device according to claim 32, wherein said active layers and clad layers are composed of GaAs or GaAlAs.

34. A light-emitting device according to claim 33, wherein said insulating or high resistance layer is composed of non-doped GaAlAs.

* * * * *

UNITED STATES PATENT AND TRADEMARK OFFICE
CERTIFICATE OF CORRECTION

PATENT NO. : 5,115,284
DATED : May 19, 1992
INVENTOR(S) : HIDESHI KAWASAKI

Page 1 of 4

It is certified that error appears in the above-identified patent and that said Letters Patent is hereby corrected as shown below:

COLUMN 1

Line 33, "enables" should read --enable--.

COLUMN 2

Line 4, "layer." should read --layers.--.
    Line 32, "layer." should read --layers.--.
    Line 67, "FIGS. 2A" should read --FIGS. 1A--.

COLUMN 4

Line 1, "said" should read --the same--.
    Line 14, "semi-conductive" should read --semiconductive--.
    Line 62, "$3 \times 10^{-4}$ mol/min." should read
           --$3 \times 10^{-4}$ mol/min.,--.
    Line 67, "n-$Ga_{0.25}Al_{0.}$-" should read --a n-$Ga_{0.75}Al_{0.}$- --.
    Line 68, "25As" should read --$_{25}$As--.

COLUMN 5

Line 13, "a conductive electrode layer 5" should read
           --the conductive electrodes 5a, 5b and 5c--.
    Line 18, "whereby" should read --whereby the--.

COLUMN 6

Line 17, "grain 7" should read --grain 17--.
    Line 18, "1st" should read --first--.
    Line 22, "grain 7" should read --grain 17--.

UNITED STATES PATENT AND TRADEMARK OFFICE
CERTIFICATE OF CORRECTION

PATENT NO. : 5,115,284
DATED : May 19, 1992
INVENTOR(S) : HIDESHI KAWASAKI

It is certified that error appears in the above-identified patent and that said Letters Patent is hereby corrected as shown below:

COLUMN 7

Line 15, "wires 16a, 16b" should read --16a, 16c--.
Line 42, "fourth clad layer 25c." should read
 --fourth clad layer 23d.--.
Line 51, "which" should read --which are--.

COLUMN 8

Line 5, "lead" should read --leak--.
Line 11, "safe" should read --same--.
Line 22, "1st" should read --first--.
Line 51, "23c," should read --23c, 23d,--.
Line 56, "bonded." should read --bonded thereto.--.
Line 57, "3rd" should read --third--.
Line 65, "3rd" should read --third--.
Line 67, "a" should read --an--.

COLUMN 9

Line 31, "shown" should read --showed--.

UNITED STATES PATENT AND TRADEMARK OFFICE
CERTIFICATE OF CORRECTION

PATENT NO. : 5,115,284
DATED : May 19, 1992
INVENTOR(S) : HIDESHI KAWASAKI     Page 3 of 4

It is certified that error appears in the above-identified patent and that said Letters Patent is hereby corrected as shown below:

COLUMN 10

Line 19, "1st" should read --first--.
Line 20, "3rd" should read --third--.
Line 24, "4th" should read --fourth--.
Line 36, "3rd" should read --third--.
Line 40, "3rd" should read --third--.
Line 53, "3rd" should read --third--.
Line 62, "33c, 33d, 33e" should read
    --33c, 33d, 33e, 33f--.
Line 65, "lead wires 36a-36g" should read
    --lead wires 36a-36f-- and
    "bonded." should read --bonded thereto.--.
Line 66, "4th" should read --fourth--.

COLUMN 11

Line 6, "4th" should read --fourth--.
Line 14, "8Al$_{0.2}$As" should read --$_8$Al$_{0.2}$As--.
Line 23, "clad layer 38c," should read
    --clad layer 33c,--.
Line 38, "bonded." should read --bonded thereto.--.
Line 40, "layer 38d" should read --33d--.
Line 49, "3rd and 4th" should read --third and fourth--.

COLUMN 12

Line 36, "light emitting" should read --light-emitting--.
Line 62, "injection" should read --injection;--.

UNITED STATES PATENT AND TRADEMARK OFFICE
CERTIFICATE OF CORRECTION

PATENT NO. : 5,115,284
DATED : May 19, 1992
INVENTOR(S) : HIDESHI KAWASAKI

It is certified that error appears in the above-identified patent and that said Letters Patent is hereby corrected as shown below:

COLUMN 13

Line 3, "first and active layers" should read
        --first and second active layers--.

COLUMN 14

Line 21, "a" should be deleted.
    Line 25, "light emitting" should read --light-emitting--.

Signed and Sealed this

First Day of February, 1994

Attest:

BRUCE LEHMAN

Attesting Officer      Commissioner of Patents and Trademarks